United States Patent [19]
Brandt et al.

[11] Patent Number: 6,011,385
[45] Date of Patent: Jan. 4, 2000

[54] METHOD AND APPARATUS FOR MEASURING AND REGULATING CURRENT TO A LOAD

[75] Inventors: Per-Olof Brandt, Staffanstorp; Leif Lingström, Lund; Torbjörn Olsson, Södra Sandby, all of Sweden

[73] Assignee: Telefonaktiebolaget LM Ericsson, Stockholm, Sweden

[21] Appl. No.: 09/007,058

[22] Filed: Jan. 14, 1998

[30] Foreign Application Priority Data

Jan. 17, 1997 [SE] Sweden ................................. 9700123

[51] Int. Cl.[7] ................................................. G05F 1/575
[52] U.S. Cl. .................... 323/280; 323/273; 323/281; 323/315
[58] Field of Search .......................... 323/269, 273, 323/280, 281, 315, 316, 350

[56] References Cited

U.S. PATENT DOCUMENTS

| | | | |
|---|---|---|---|
| 3,976,895 | 8/1976 | Koo | 307/235 |
| 4,017,748 | 4/1977 | Davis | 307/296 |
| 4,251,743 | 2/1981 | Hareyama | 323/316 |
| 4,446,419 | 5/1984 | van de Plassche et al. | 323/316 |
| 4,580,070 | 4/1986 | Westman | 307/350 |
| 4,827,207 | 5/1989 | Chieli | 323/316 |
| 5,084,668 | 1/1992 | Kotowski et al. | 323/280 |
| 5,144,223 | 9/1992 | Gillingham | 323/281 |
| 5,254,992 | 10/1993 | Keen et al. | 341/119 |
| 5,285,148 | 2/1994 | Uhlenhoff et al. | 323/316 |
| 5,339,046 | 8/1994 | Kornfeld et al. | 330/277 |
| 5,424,663 | 6/1995 | Wong | 327/65 |
| 5,612,614 | 3/1997 | Barrett et al. | 323/316 |
| 5,646,518 | 7/1997 | Lakshmikumar et al. | 323/316 |

FOREIGN PATENT DOCUMENTS

| | | | |
|---|---|---|---|
| 0 356 570 | 3/1990 | European Pat. Off. | G05F 3/26 |
| 0 403 195 | 12/1990 | European Pat. Off. | G05F 3/26 |
| 3819370 | 12/1989 | Germany | G01R 19/00 |
| 2-121374 | 9/1990 | Japan | H01L 39/22 |

*Primary Examiner*—Jeffrey Sterrett
*Attorney, Agent, or Firm*—Burns, Doane, Swecker & Mathis, L.L.P.

[57] ABSTRACT

A device for controlling a current to a load by means of mirroring is described. Two transistor units are connected to a common reference point. By driving a current through one of the transistor units, a corresponding current is generated in the second transistor unit. A control unit, connected between the transistors can regulate a voltage difference between transistors. Accordingly, the size of the load attached is determined through mirroring with accuracy and minimal power loss.

49 Claims, 9 Drawing Sheets

METHOD AND APPARATUS FOR MEASURING AND REGULATING CURRENT TO A LOAD

TECHNICAL FIELD

The present invention relates to a device and a method for, by means of mirroring, controlling the size of a current to a load or, as an alternative, for measuring the size of the current with a minimal power loss and with a large accuracy.

STATE OF THE ART

The supply voltage to different electrical circuits, e.g. a load, is tending to become lower and lower which results in an increase in the requirement for low current consumption. This results in a need to reduce the different voltage drops which can occur in the electrical circuits when they are used.

One example is the voltage drop which occurs when the size of a current to a final stage in a portable radio equipment is to be determined.

The term "portable radio equipment" comprises all portable equipment which is arranged for radio communication, such as e.g. mobile telephones, pagers, telefax and printer devices and communicators, i.e. telephones with computers and inbuilt calendars. Said equipment can be used in some type of radio network, e.g. cellular networks, satellite networks or smaller local networks.

A known device and method for determining the size of the said current uses a measuring resistance over which a voltage is measured. The current is made to pass through a known low-ohmic resistance over which the voltage is measured. As the voltage is proportional to the current (U=R*I), the current can easily be calculated. The measuring resistance results in a noticeable power loss. With varying temperatures the resistance in the resistor changes which alters the measuring accuracy.

The Japanese Patent JP 2121374 describes a device for determining a current by measuring a current with low resistive losses. The current which is to be measured is driven through an s-field effect transistor (SFET). The gate of the transistor is connected to a MOS-field effect transistor (MOSFET). The MOS-field effect transistor is driven by a current generator with a known current which gives a certain voltage value on a node between the current generator and the MOS-field effect transistor. When the current through the s-field effect transistor is changed, the voltage on its gate is also changed which in turn influences the voltage on the gate of the MOS-field effect transistor. This results in that the voltage value on the node changes in step with the current through the s-field effect transistor. By reading off said voltage on the node, the current through the s-field effect transistor can be determined.

It is previously known to mirror a first current in a first branch to a second current in a second branch by using a so-called current mirror with transistors. In a connection with a current mirror the transistors are arranged as controllable current gene-rators. The transistors are thereby active and work in the saturation region. This involves high power losses.

DISCLOSURE OF THE INVENTION

The present invention tackles a problem which occurs when the size of a current is to be measured with a minimal power loss. More closely defined, the problem occurs when the available power to a load is greatly limited and the size of its current is to be measured without generating any power losses worth mentioning.

A similar problem which the invention tackles occurs when a current is to be controlled to a certain value without generating any power losses worth mentioning.

A further problem which the invention tackles occurs when certain parameters in constituent circuits change and/or vary because of temperature changes, component spread, measuring voltage variations or the like. This causes variations in the accuracy of a current measuring or current control.

Yet another problem which is tackled is the difficulty of measuring or controlling both extremely small and large currents with the same accuracy.

An object of the present invention is consequently to determine the size of a load current by mirroring a current in such a way that the size of the load current can be controlled to a definite value with great accuracy and with a minimal power loss.

Another object of the present invention is to determine the size of the load current by mirroring the load current in such a way that its size can be measured with great accuracy and with a minimal power loss.

The invention relates to a device and a method for solving said problems. The invention is based upon the idea that a first current with a certain value from a first unit is mirrored in a second current from a second unit in a manner having an economical use of power. A certain relationship between a circuit parameter of the first and the second unit is defined. A third, active, unit regulates a certain voltage between the first and the second unit to a definite value in such a way that the size relationship between the first and the second current is equal to the defined relationship between the circuit parameters of the units. In this way the second current will be set to a certain value which is dependent on the value of the first current.

The invention uses two transistor units which are connected to each other. By driving a current through one of the transistor units, a corresponding current, although differing in size, is formed in the second transistor unit. In this way the current from one transistor unit is mirrored in the current in the second transistor unit. The two transistor units are connected so that they can work partly in a condition where their power losses are minimal and partly in such a way that it is easy to adjust the accuracy in the mirroring. The two transistor units have the same characteristics except that one of the transistor units can conduct a greater current than the other.

A device according to the invention comprises a first transistor unit of a certain type which supplies a load with a main current. A second transistor unit, preferably of the same type as the first transistor unit, is on the one hand connected to a current generator and on the other hand connected to the first transistor unit. The first transistor unit has a greater current capacity than the second transistor unit, which gives a certain known scaling relationship between them. A control unit is arranged between the transistor units to control a voltage between the transistor units. A size relationship between the different currents is equal to the scaling relationship when the main current through the first transistor unit causes a voltage drop over the first transistor unit which is the same size as a corresponding voltage drop over the second transistor unit. By hold-ing these two voltage drops the same, a mirroring is achieved between the main current and the control current with a known size relationship between the two currents. This size relationship can then be used for controlling the main current through the control current and/or for measuring the size of the main current through the control current.

The transistor units are also connected to a reference voltage, the value of which can regulate the accuracy of the device with differently sized currents. The two transistor units can be realized by means of one or more transistors per transistor unit.

The method according to the invention consists of the two transistor units in the device being made to work as variable resistors, whereafter a current is driven through each transistor unit. By measuring the voltage difference between the transistor units the size relationship between the currents is controlled. At a certain value of the voltage difference the size relationship between the currents is known. This implies that one current can be used for measuring or controlling the other current. The resistance of the transistor units can, when required, be regulated in order to adjust the accuracy of the device.

The advantage of the present invention is that, with a minimal power loss, it can be arranged for measuring or controlling a current and that it takes up a smaller space on a circuit board than earlier known solutions. This reduces the costs for manufacturing the device and permits a reduction of the volume of the device. If the device is powered by a battery, the invention results in that the battery lasts longer than previously. The invention also results in that more power in the device is available for the functions of the device, e.g. a higher output power from a final stage.

Yet another advantage of the present invention is that it also permits the possibility of adjusting the sensitivity of a current measurement or a current control, upwards or downwards, depending on the desired function of the device and the size of the current. This implies that the invention can be used in an extremely wide current interval with good accuracy. Said adjustment possibility can also be used in order to compensate for temperature variations, component spread, variations in the measuring voltage. This results, amongst others, in that the device and the method is extremely temperature stable.

DESCRIPTION OF THE FIGURES

The invention will now be described with reference to the appended drawings.

PREFERRED EMBODIMENTS

As mentioned earlier, the invention comprises a first and a second transistor unit. An example of suitable transistors which can be comprised in these transistor units are MOS-transistors.

Figure 1:
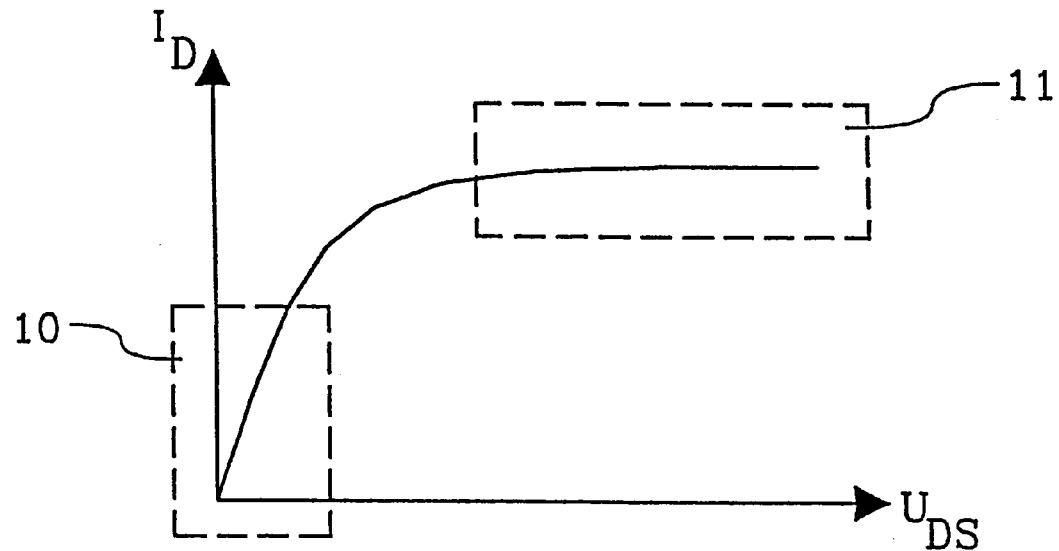
FIG. 1 shows a diagram of the current-voltage characteristic of a MOS-transistor.

FIG. 1 shows a diagram of the current-voltage characteristic of a MOS-transistor. A first part of said curve is known as the ohmic region 10 while a last part is known as the saturation region 11. With low drain voltages $U_{DS}$ (ohmic region) the transistor functions as a variable resistance ($U_{DS} \sim I_D$) and with higher drain voltages $U_{DS}$ (saturation region) the transistor functions as a current generator ($I_D$= constant).

Figure 2:
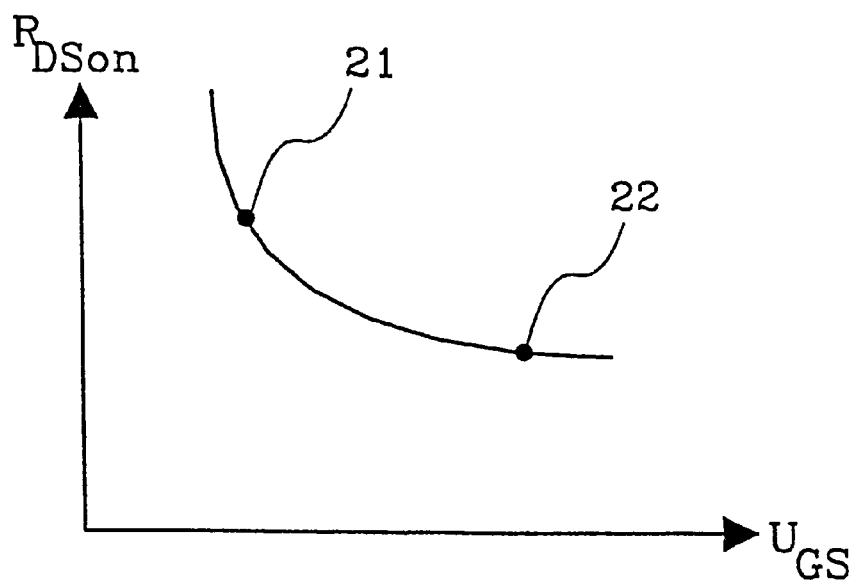
FIG. 2 shows a diagram of the relationship between the internal resistance $R_{DSon}$ of the MOS-transistor and its gate-source voltage $U_{GS}$.

FIG. 2 shows a diagram of the relationship between the internal resistance $R_{DSon}$ of the MOS-transistor and its gate-source voltage $U_{GS}$.

Figure 3:
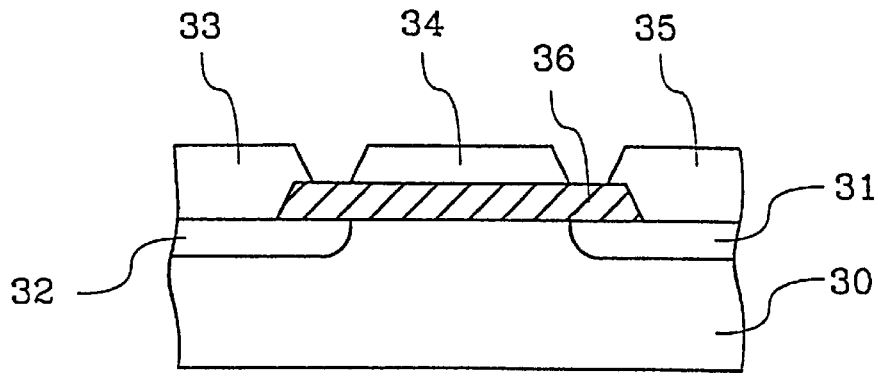
FIG. 3 shows a principle view of a MOS-transistor.

FIG. 3 shows a principle view of a MOS-transistor. At the surface of a substrate 30, e.g. a p-type silicon substrate, there are two N-doped regions 31 and 32, a source 33 and a drain 35. Between the source 33 and the drain 35 is the gate 34 which is insulated from the substrate 30 through a thin oxide layer 36. The source, gate and drain are together called the channels of the transistor.

Figure 4:
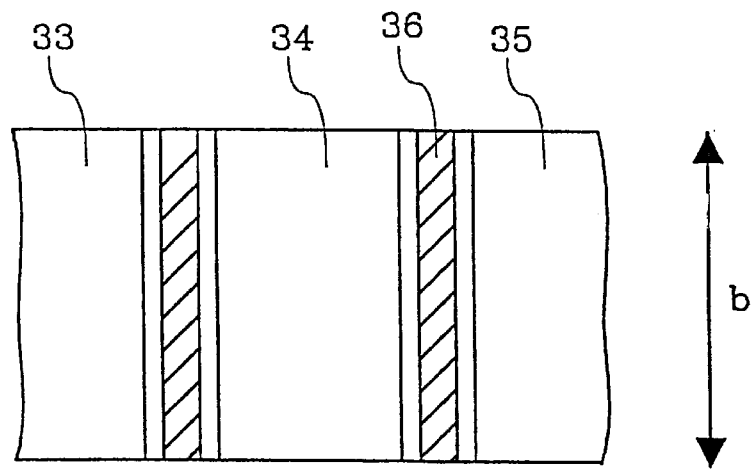
FIG. 4 shows a view from above of a MOS-transistor.

FIG. 4 shows the MOS-transistor from above and its channel width b.

Figure 5:
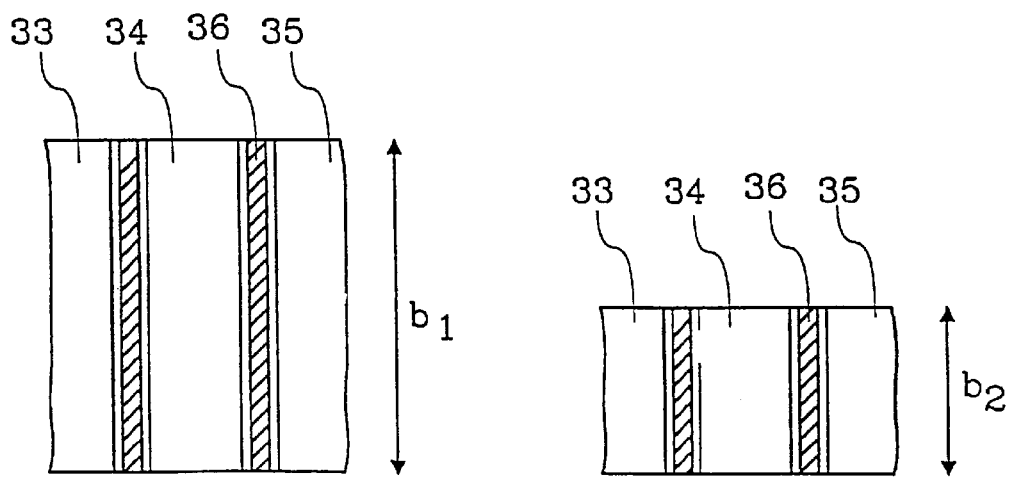
FIG. 5 shows a view from above of two MOS-transistors with different channel widths.

Two transistors of the same type but with different channel widths b have different current capacities. The transistor which has wider channels $b_1$, see FIG. 5, can drive a greater current than the transistor which has narrower channels $b_2$ with the same current density in the respective channel. A width relationship between the two transistors with different widths $b_1$ and $b_2$ of the channels gives a certain scaling factor K where $K=b_1/b_2$. The current amplification factor $\beta$ of a transistor is directly proportional to its channel width b. This implies that the quotient between the current amplification factors $\beta$ of the two transistors is equally large as the scaling factor K.

Figure 6:
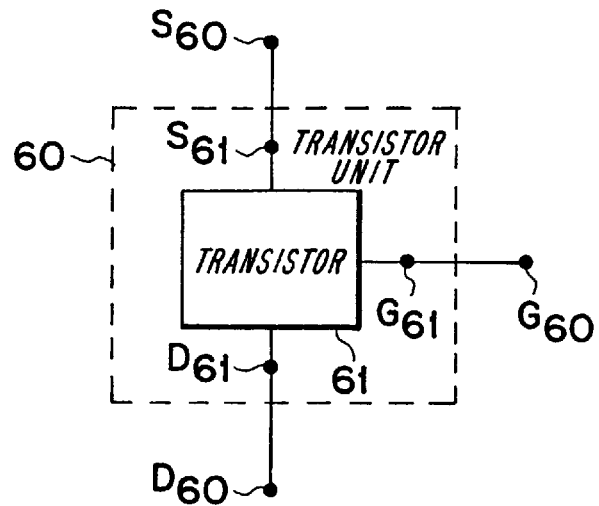
FIG. 6 shows a view of a first example of a transistor unit, comprising one transistor.

FIG. 6 shows a view of a first example of a transistor unit 60 in the form of a transistor 61. When the transistor unit 60 is a transistor 61, then a drain $D_{60}$, a source $S_{60}$ and a gate $G_{60}$ of the transistor unit 60 corresponds to a drain $D_{61}$, a source $S_{61}$ and a gate $G_{61}$ of the transistor 61. In this example the channel width b of the tran-sistor 61 also corresponds to the channel width b of the transistor unit 60.

Figure 7:
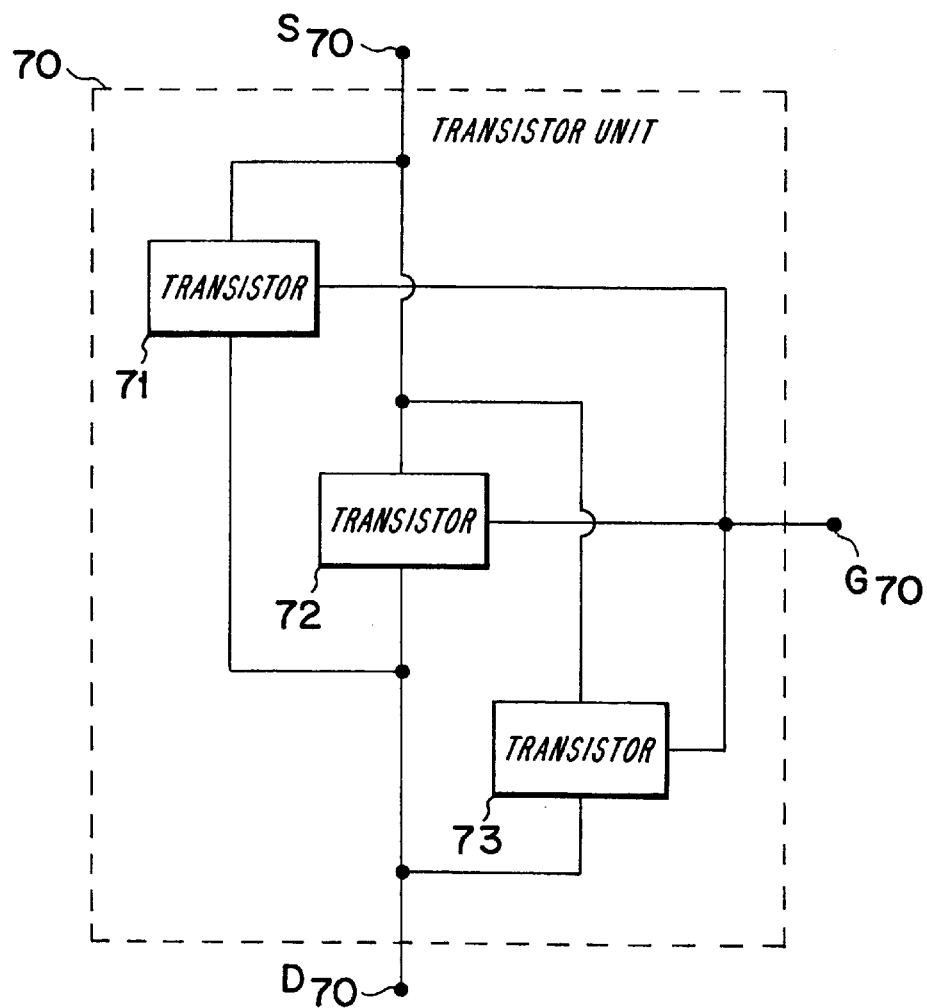
FIG. 7 shows a view of a second example of a transistor unit, comprising three transistors.

FIG. 7 shows a view of a second example of a transistor unit 70, comprising three transistors 71, 72 and 73. A drain on the respective transistors is connected to a drain $D_{70}$ of the transistor unit 70. A source on the respective transistors is connected to a source $S_{70}$ of the transistor unit 70. A gate on the respective transistors is connected to a gate $G_{70}$ on the transistor unit 70. In this example, the channel width b of the transistor unit is equal to the sum of the channel widths of the transistors.

Figure 8:
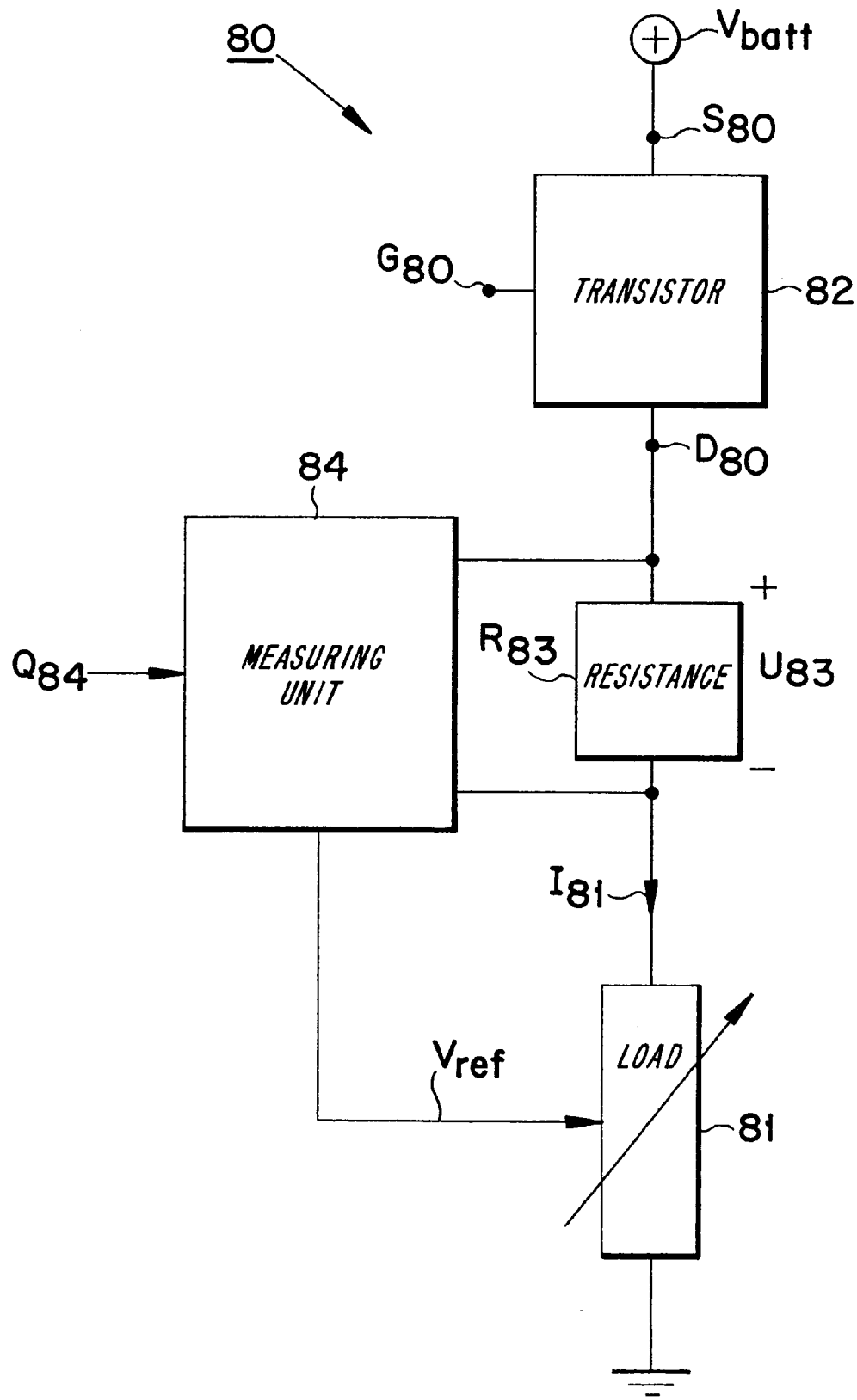
FIG. 8 shows a block diagram of a known connection which measures current.

FIG. 8 shows a known device 80 for measuring a current $I_{81}$ to a load 81. The current $I_{81}$ from a transistor 82, which is connected to a supply voltage $V_{batt}$, is made to pass through a known low ohmic resistance $R_{83}$ over which the voltage $U_{83}$ is measured. As the voltage $U_{83}$ is proportional to the current ($U_{83}=R_{83}*I_{81}$), the current $I_{81}$ can be easily calculated by a measuring unit 84. The measuring unit 84 gives a reference voltage $V_{ref}$ to the load 81. The value of $V_{ref}$ depends, on the one hand, on the size of $I_{81}$ and, on the other hand, on a desired value $Q_{64}$ from another part of the system to which the device 80 is connected. The resistance $R_{83}$ causes a noticeable power loss. With varying temperatures, the resistance in the resistance $R_{83}$ changes, which changes the measuring accuracy. The measuring unit 84 has difficulties in measuring both small and large changes of $I_{81}$ with the same accuracy when $R_{83}$ is constant (at constant temperature).

Figure 9:
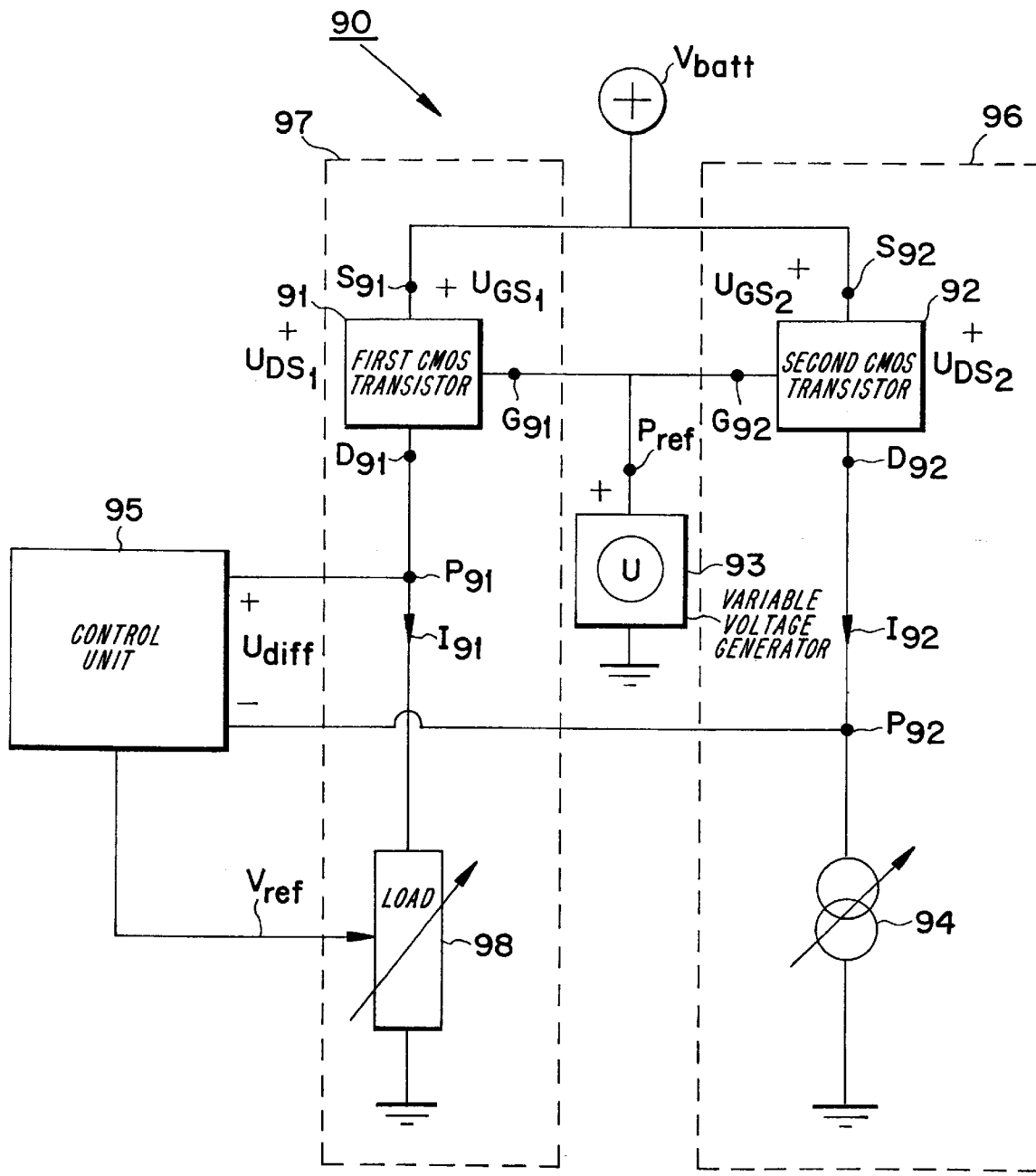
FIG. 9 shows a block diagram of a first embodiment of a device according to the invention.

FIG. 9 shows a first embodiment of a device 90 according to the invention for mirroring a current. In this embodiment a control current $I_{92}$ is mirrored in a main current $I_{91}$ and the size of the control current $I_{92}$ controls the size of the main current $I_{91}$.

A first and a second transistor unit, in the form of the transistors of a first 91 and a second 92 p-channel, are connected to the supply voltage $V_{batt}$ via sources $S_{91}$ and $S_{92}$ on the respective transistors. The gates $G_{91}$ and $G_{92}$ on the respective transistors are connected to a common reference point $P_{ref}$, which in turn is connected to a controllable voltage generator 93. The gates $G_{91}$ and $G_{92}$ on the respective transistors can even be connected to separate reference points $P_{ref}$.

The second transistor 92 is connected via a drain $D_{92}$ to a controllable current generator 94, which in its turn is connected to earth. The controllable current generator 94 drives the control current $I_{92}$, which is to be mirrored, through the second transistor 92.

The first transistor 91 is connected via a drain $D_{91}$ to a load 98. The main current $I_{91}$ is emitted from the first transistor 91 to the load 98.

A control unit 95 is connected to a first connection point $P_{91}$ between the load 98 and the drain $D_{91}$ of the first transistor and to a second connection point $P_{92}$ between the drain $D_{92}$ of the second transistor and the controllable current generator 94.

A defined first parameter, the channel width, $b_1$ of the first transistor 91 is considerably larger than a defined second parameter, the channel width, $b_2$ of the second transistor 92. The scaling factor K ($K=b_1/b_2$) between the transistors can e.g. be within the interval 50–200.

The controllable current generator 94 is adjusted to drive the control current $I_{92}$ through the second transistor 92, which gives rise to a voltage drop $U_{DS2}$ over the second transistor.

The control unit 95 is arranged to measure the voltage in the respective connection points $P_{91}$ and $P_{92}$ to form a voltage difference $U_{diff}$ between the connections points. The control unit 95 regulates the size of the main current $I_{91}$ in such a way that the voltage difference $U_{diff}$ becomes as close to 0 V as possible. This implies that the main current $I_{92}$ becomes a mirroring of the control current $I_{92}$.

The main current $I_{91}$ is regulated through the control unit 95 emitting a control signal $V_{ref}$ to the load 98, which results in a current change in the load 98. The current change in the load 98 results in turn in a voltage change in the connection point $P_{91}$. In this way the voltage in the connection point $P_{91}$ is regulated so that it will have the same value as the voltage in the connection point $P_{92}$. This results in that a voltage drop $U_{DS1}$ and the voltage drop $U_{DS2}$ over the respective transistors become equal and that the size of the main current $I_{91}$ becomes K times greater than the control current $I_{92}$ (the size relationship between the currents becomes K). This implies that the smaller control current $I_{92}$ is mirrored in the larger main current $I_{91}$ by a factor K.

If a new value of the main current to the load is desired, the control current $I_{92}$ is adjusted to a new value through the controllable current generator 94 being adjusted. This then results in that the main current $I_{91}$ is set and mirrored to a new value according to the above.

The transistors 91 and 92 are arranged so that they can work in the ohmic region 10 (FIG. 1) where the transistors act as variable resistors. By varying the potential in the reference point $P_{ref}$ with the voltage generator 93, the gate-source voltage $U_{GS}$ is changed which in its turn influences the internal resistance $R_{DSon}$ of the transistors, see FIG. 2. The internal resistance of the transistors can be both reduced or increased. With extremely small currents (low powers) it is good to be able to increase the resistance so that it will be easier to detect and regulate small changes in the currents, see point 21 in FIG. 2. With large currents (high powers) the resistance should be low so that the power losses become minimal, see point 22 in FIG. 2. It is also possible to compensate for temperature variations, component spread and variations in the supply voltage by regulating the internal resistance $R_{DSon}$ of the transistors.

The reference point $P_{ref}$ can be connected to earth or to another fixed potential instead of the voltage generator 93. The transistors must, however, still be arranged so that they work in the ohmic region 10 (FIG. 1). In this case the possibility of regulating the resistance is lacking.

The total power losses in the second transistor 92 and the controllable current generator 94 become extremely small as they can work with extremely small currents $I_{92}$ at the same time as the transistor 92 works in the ohmic region 10.

All types of transistors, e.g. MOSFET, can be used in the invention. The transistors 91 and 92 in one and the same device 90 should preferably be of the same type, e.g. of MOSFET-type. If two transistor units in the shape of two n-channel transistors are to be used, their drains can be connected to the supply voltage $V_{batt}$ and their sources to the current generator 94 resp. the load 98.

In some cases an already existing transistor can be used as the first transistor 91 in FIG. 9. An example is a transistor which is used for connecting resp. disconnecting a final stage.

The transistors 91 and 92 can be arranged on the same chip and/or in the same capsule but they can also be placed in separate capsules. If the transistors are arranged in separate capsules, they must be accurately calibrated. It is also possible to integrate the two transistors 91 and 92, the current generator 94 and the control unit 95 on one chip.

The control unit 95 can e.g. comprise an operational amplifier, the inputs of which are connected to the connection points $P_{91}$ and $P_{92}$ while its output is connected to the load 98.

The device 90 in accordance with the invention, according to FIG. 9, is arranged for controlling the size of the main current $I_{91}$ by means of the control current $I_{92}$. This eliminates a requirement for directly measuring the main current $I_{91}$ because its size is given by how the control current $I_{92}$ is controlled.

The device 90 can, for example, be arranged in order to control a current to a final step in a transmitter unit which is part of a portable radio equipment. The device 90 can also be arranged for controlling one or more currents in a receiver unit which is part of a portable radio equipment.

Figure 10:
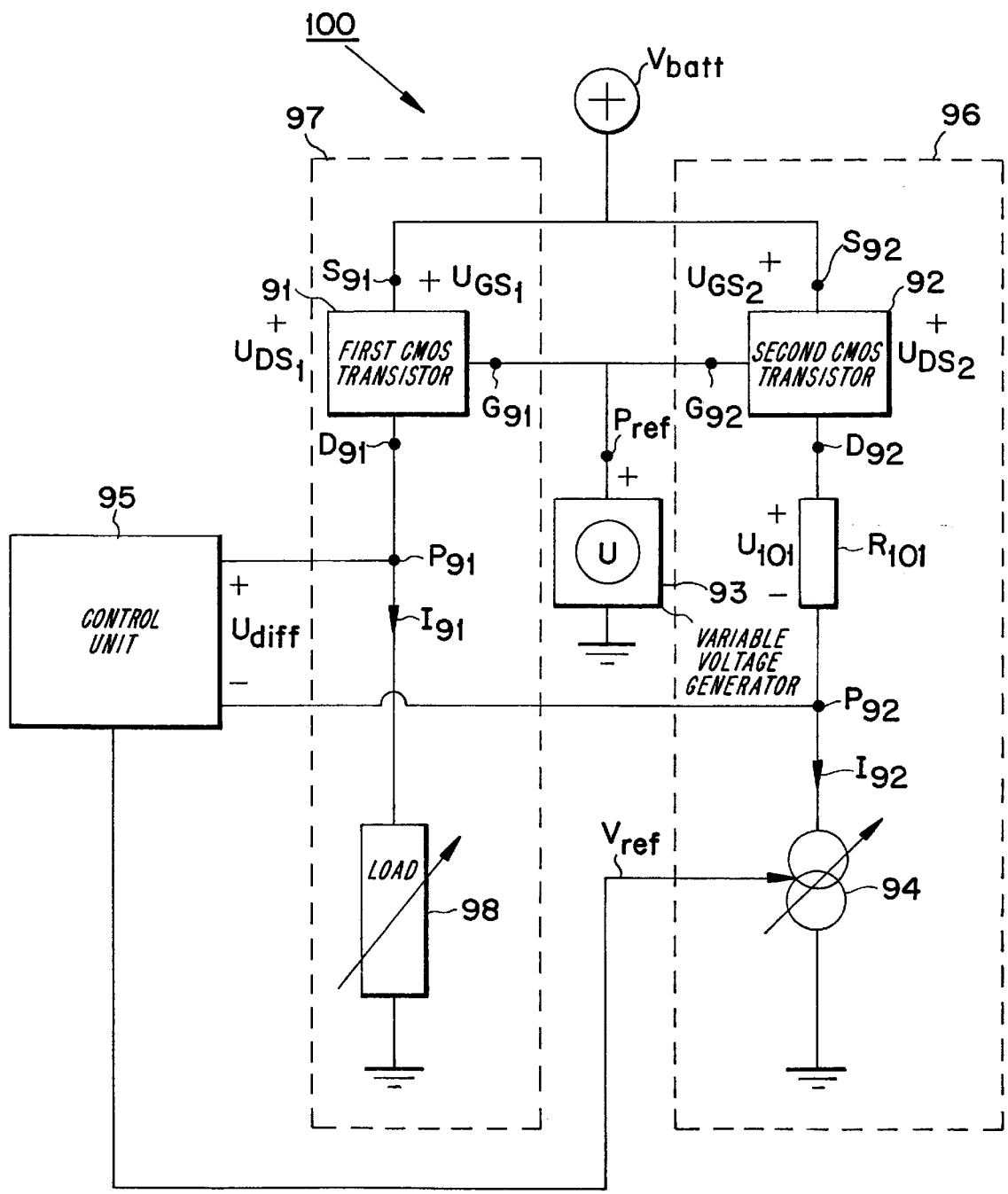
FIG. 10 shows a block diagram of a second embodiment of a device according to the invention.

FIG. 10 shows a second embodiment of a device 100 in accordance with the invention for mirroring a current. In this embodiment the main current $I_{91}$ is to be mirrored in the control current $I_{92}$ and the size of the main current $I_{91}$ is to control the size of the control current $I_{92}$.

The second embodiment is based on the first embodiment in connection to FIG. 9.

In the second embodiment the control unit 95 is connected to the controllable current generator 94 instead of to the load 98. The control unit 95 is arranged in order to regulate the size of the control current $I_{92}$ so that the voltage difference $U_{diff}$ becomes as close to the 0 V as possible. This implies that the control current $I_{92}$ becomes a mirroring of the main current $I_{91}$, which is the opposite of the first embodiment. The control current $I_{92}$ is regulated through the control unit 95 controlling the controllable current generator 94 via the control signal $V_{ref}$. By measuring the size of the control current $I_{92}$ its size can be determined. From this measured value the size of the main current can be calculated as $I_{92}*K$. When the control current $I_{92}$ is small, it can, for example, be measured in a known way by means of a measurement resistance $R_{101}$, between the transistor 92 and the controllable current generator 94, without any large power losses.

The device 100 in accordance with the invention, according to FIG. 10, is arranged in order to measure the size of the main current $I_{91}$ by means of the control current $I_{92}$.

For the rest, the second embodiment corresponds to the first embodiment in connection to FIG. 9.

The device 100 can, for example, be arranged in order to measure a current to a final step in a transmitter unit which is part of a portable radio equipment. The device 100 can also be arranged for measuring one or more currents in a receiver unit which is part of a portable radio equipment.

A first method for controlling the main current $I_{92}$ by means of a mirroring according to the suggested invention, can quite generally be described with reference to a flow diagram in FIG. 11.

In a first step 111 a certain constant first current is set in a first resistive branch 96, see FIG. 9. This step corresponds in FIG. 9 of the control current $I_{92}$ being adjusted by means of the current generator 94.

In a second step 112 the first current is represented by a second current in a second resistive branch 97, see FIG. 9, comprising the load 98. This can, for example, be achieved by a current mirroring between the two transistors 91 and 92 in FIG. 9. The current $I_{91}$ in the second resistive branch 97 becomes greater than the current $I_{92}$ in the first resistive branch 96 when the transistor 91 has a greater channel width b than the transistor 92.

In a third step 113 a quantity is formed which corresponds to the difference between the size of the first and the second current. This step corresponds in FIG. 9 of the difference voltage $U_{diff}$ being formed.

In a fourth step 114 the size relationship between the current is checked by checking the size of the quantity. If the value is equal to a predetermined value, preferably 0 (Yes in FIG. 11), the method continues to a sixth step 116. This corresponds in FIG. 9 by the main current $I_{91}$ being K times greater than the control current $I_{92}$. If the value is not equal to the predetermined value (No in FIG. 11), the method continues to a fifth step 115.

In the fifth step 115 the second current is adjusted so that the said quantity essentially takes up the predetermined value, which results in the second current essentially becoming K times greater than the first current. This step corresponds in FIG. 9 by the control unit 95 giving a desired value $V_{ref}$ to the load 98 which results in the load 98 reducing or increasing the current $I_{91}$ until the difference voltage $U_{diff}$ essentially becomes 0 V.

In the sixth step 116 a decision is taken on whether the size of the first current is to be adjusted. If the first current is to be adjusted, the method goes back to the first step 111. This corresponds in FIG. 9 to the control current $I_{92}$ being adjusted to a new value by means of the current generator 94. If the first current is not to be adjusted, the method returns to the third step 113. This corresponds in FIG. 9 to the difference voltage $U_{diff}$ being checked again.

If some other adjustment is not to take place, the method can be stopped or repeated at certain defined intervals. Another method for controlling the $I_{91}$ by means of mirroring according to the suggested invention is based upon the first method. Quite generally, the second method is described with reference to a flow diagram in FIG. 12.

Figure 11:
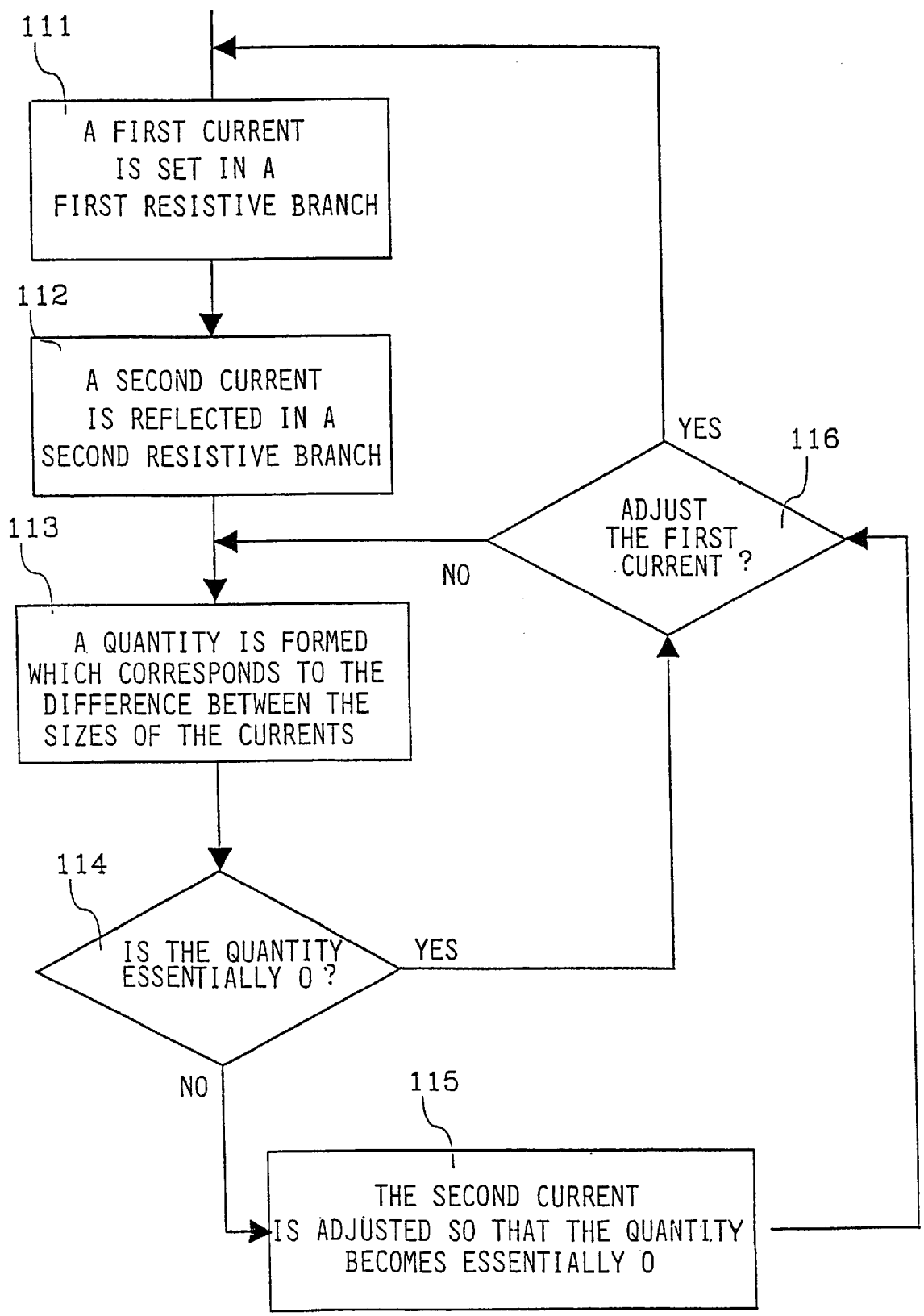
FIG. 11 shows a block diagram of a first suggested method for controlling a current by means of the invention.
Figure 12:
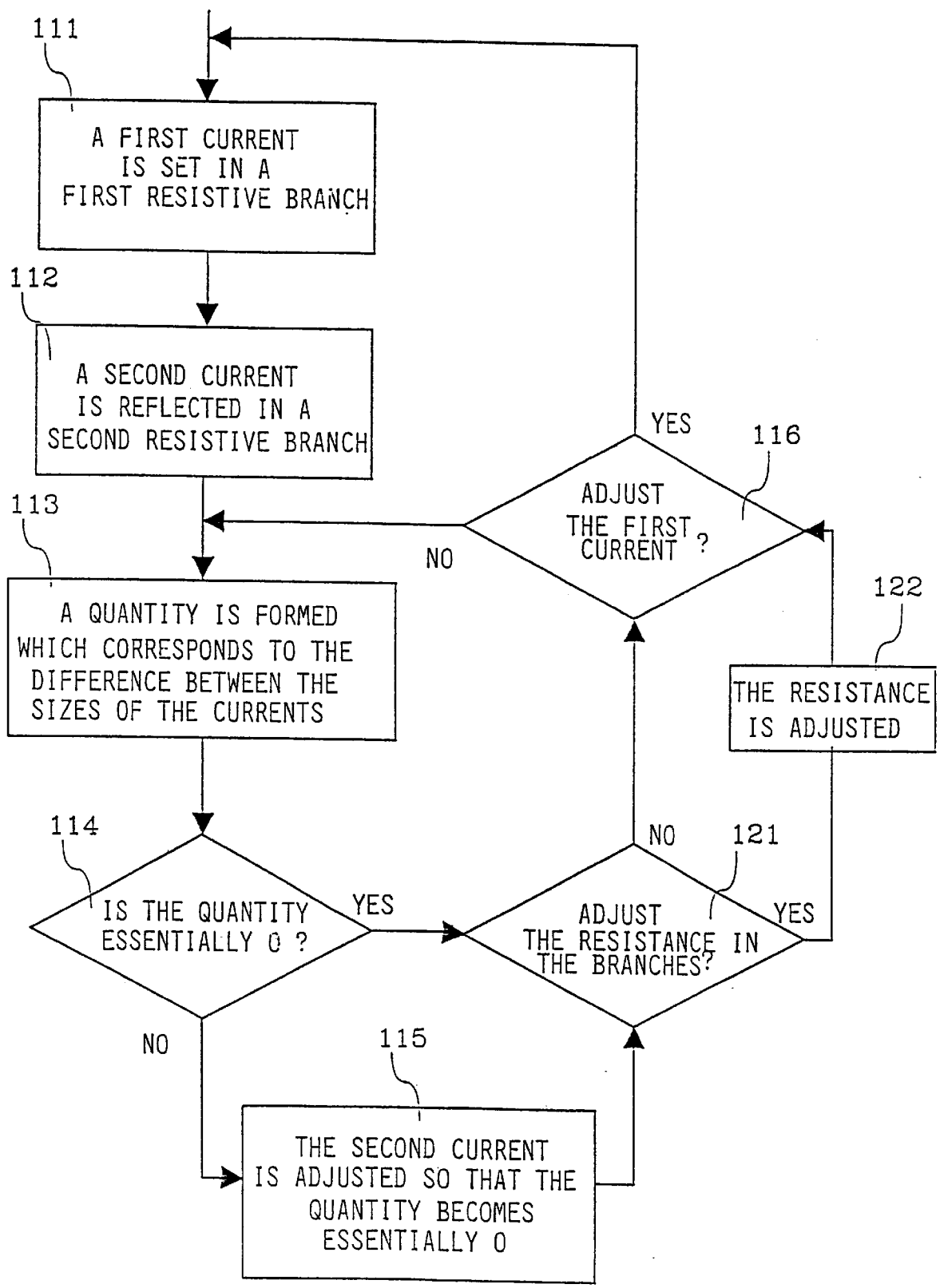
FIG. 12 shows a block diagram of a second suggested method for controlling a current by means of the invention.

The first three steps 111–113 according to FIG. 12 correspond to the three first steps 111–113 according to FIG. 11.

If the value in the fourth step 114 in FIG. 12, according to the first method, is the predetermined value, preferably 0, the method continues with a seventh step 121. If the value is not the same as the predetermined value, the method continues with the fifth step 115, according to the first method.

After the fifth step 115 the method continues with the seventh step 121.

In the seventh step 121 it is decided whether the resistance in the resistive branches is to be adjusted. If the resistance is not be adjusted, the method continues with the sixth step 116, according to the first method. If the resistance is to be adjusted, the method continues with an eighth step 122. The resistance is adjusted amongst others in order to compensate for temperature variations, different sizes of the current and component spread.

In the eighth step 122 the resistance is adjusted in the two resistive branches, whereafter the method returns to the sixth step 116, according to the first method. This corresponds in FIG. 9 to the gate-source voltage $U_{GS}$ of the respective transistors 91 and 92 being adjusted by the voltage generator 93 in order to change the inner resistance $R_{DSon}$ in the transistors.

Figure 13:
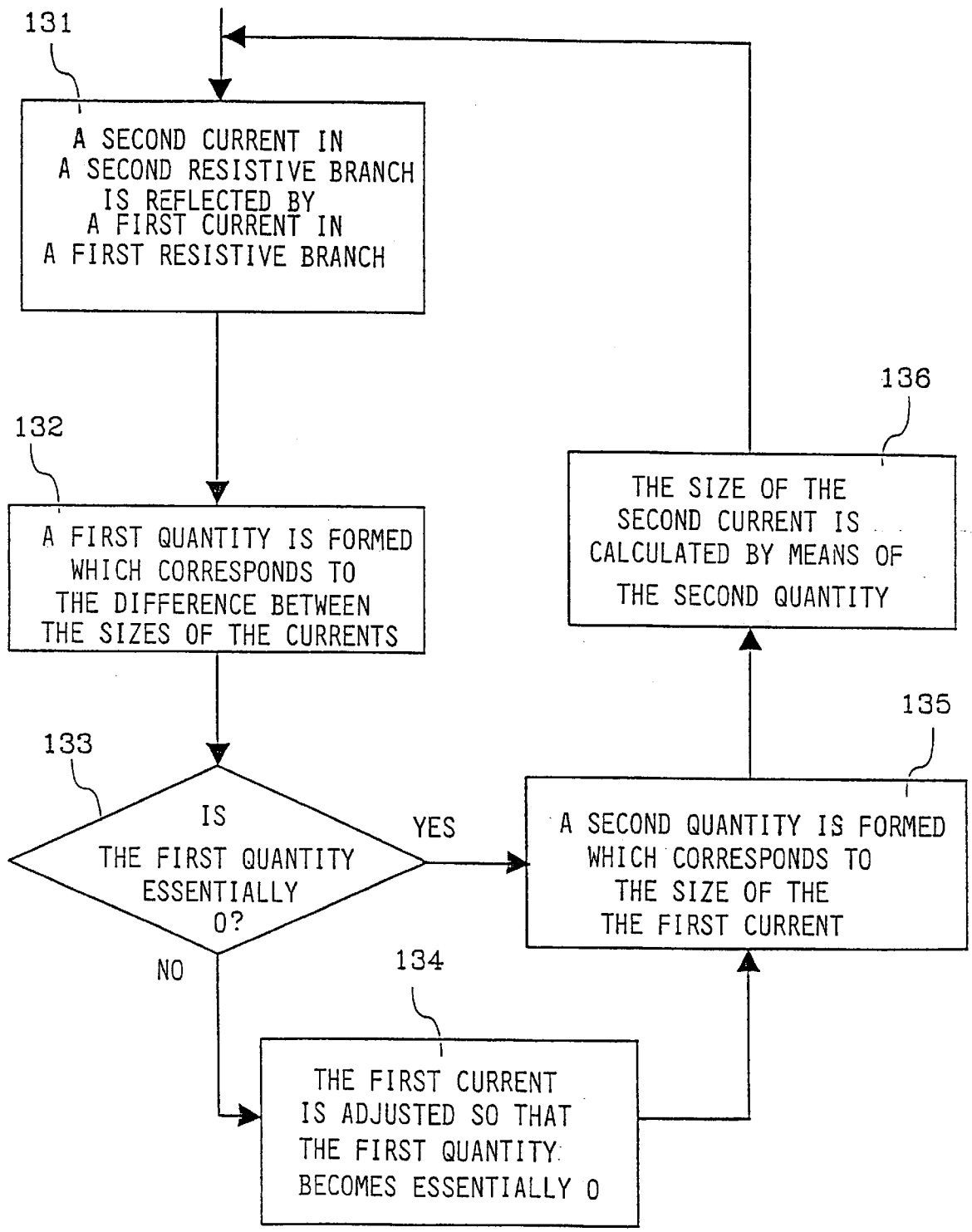
FIG. 13 shows a block diagram of a suggested method for measuring a current by means of the invention.

A method for measuring the main current $I_{91}$ by means of a mirroring according to the suggested invention can quite generally be described with reference to a flow diagram in FIG. 13.

In a first step 131 a certain second current in a second resistive branch 97 is reproduced from a first current in a first resistive branch 96, see FIG. 10. This step corresponds in FIG. 10 to a current mirroring between the two transistors 91 and 92 being performed. The current $I_{91}$ in the second resistive branch 97 is greater than the current $I_{92}$ in the first resistive branch 96 when the transistor 91 has a greater channel width b than the transistor 92.

In a second step 132 a first quantity is formed which corresponds to the difference between the first and the second current size. This step corresponds in FIG. 2 to the formation of the difference voltage $U_{diff}$.

In a third step 133 the size relationship between the currents is checked through the size of the first quantity being checked. If the value is equal to a predetermined value, preferably 0 (Yes in FIG. 13), the method continues with a fifth step 135. This corresponds in FIG. 10 to the main current $I_{91}$ being K times greater than the control current $I_{92}$. If the value is not equal to the predetermined value (No in FIG. 13), the method continues with a fourth step 134.

In the fourth step 134 the second current is adjusted so that the first quantity in general takes up the predetermined value, which leads to the first current essentially becoming 1/K of the second current. This step corresponds in FIG. 10 to the control unit 95 giving a desired value $V_{ref}$ to the controllable current generator 94 which leads to the current generator reducing or increasing the control current $I_{92}$ until the difference voltage $U_{diff}$ essentially becomes 0 V.

In the fifth step 135 a second quantity $U_{101}$ is formed which corresponds to the size of the first current. This step corresponds in FIG. 10 to a voltage $U_{101}$ over the measuring resistance $R_{101}$ being measured, whereby the control current $I_{92}$ is calculated as being $U_{101}/R_{101}$.

In a sixth step 136 the size of the second current is calculated. This step corresponds in FIG. 10 to the main current $I_{91}$ being calculated as $I_{91}=K*(U_{101}/R_{101})$.

If no more measuring is to take place, the method can be discontinued or repeated at certain defined intervals.

If the resistance in the resistive branches 96 and 97 needs to be adjusted, the steps 121 and 122 according to the second method for controlling the main current $I_{91}$ can be performed.

The invention can wholly or partly be realized with a processor and associated software.

We claim:

1. A device for controlling the size of a main current to a value by mirroring between a control current and the main current, comprising:

first and second transistor units operating in an ohmic state, wherein each transistor unit is connected to a supply voltage and to a reference point, said first transistor unit is connected to a load and emits a current to the load, the second transistor unit is arranged such that a mirroring occurs between the control current driven through said second transistor unit and the main current, wherein the magnitude of current driven through the first and second transistor units is affected by first and second parameters, $b_1$ and $b_2$, respectively, and wherein $b_1/b_2$ represents a scaling factor, K, which is greater than 1;

a current generator which is arranged to drive the control current through the second transistor unit; and a control unit arranged to regulate the main current to the load so that a voltage difference between a voltage drain of said transistor unit becomes substantially 0 V and wherein the size of the main current is the control current multiplied by said scaling factor K.

2. Device according to claim 1, wherein the current generator is controllable in order to be able to set a definite value for the control current.

3. Device according to claim 1, wherein the parameters $b_1$ and $b_2$ represent the channel width of the transistor unit.

4. Device of claim 1, wherein the first and second transistors function as variable resistors.

5. Device according to claim 1, wherein the ohmic state is determined based on a relationship between a drain current and a gate-drain voltage of said transmitter units.

6. Device according to claim 5, wherein the control unit is connected to a first connection point between the load and a drain of the first transistor unit and to a second connection point between a drain of the second transistor unit and the current generator.

7. Device according to claim 1, wherein the control unit is connected to the load.

8. Device according to claim 1, wherein the two transistor units and the control unit are integrated onto the same chip.

9. Device according to claim 1, wherein the device is arranged in at least one transmitter unit in a portable radio equipment for controlling at least one current.

10. Device according to claim 1, wherein a variable voltage generator is connected to the reference point.

11. Device according to claim 1, wherein the reference point is grounded.

12. Device according to claim 1, wherein the load is a final stage.

13. Device according to claim 1, wherein the first and the second transistor units are a first and a second CMOS-transistor, whereby an emitter on the respective transistors is connected to the supply voltage, and a gate on the respective transistors is connected to the reference point, and wherein a drain on the first transistor is connected to the load and a drain on the second transistor is connected to the current generator.

14. Device of claim 13, wherein said CMOS transistor units are p-channel transistor units.

15. Device according to claim 13, wherein the two transistors are arranged on the same chip.

16. Device according to claim 13, wherein the two transistors are arranged a capsule.

17. Device according to claim 13, wherein the two transistors and the control unit are integrated onto the same chip.

18. Device according to claim 1, wherein the two transistor units are arranged a capsule.

19. Device according to claim 1, wherein the two transistor units are arranged on the same chip.

20. A device for measuring the size of a main current to a load by mirroring between a control current and the main current, comprising:

first and second transistor units operating in an ohmic state, wherein each transistor unit is connected to a supply voltage and to a reference point, said first transistor unit is connected to a load and emits a current to the load, the second transistor unit is arranged such that a mirroring occurs between the control current driven through said second transistor unit and the main current, wherein the magnitude of current driven through the first and second transistor units is affected by first and second parameters, $b_1$ and $b_2$, respectively, and wherein $b_1/b_2$ represents a scaling factor, K, which is greater than 1;

a controllable current generator which is arranged to drive the control current through the second transistor unit; and a control unit arranged to regulate the controllable current generator so that a voltage difference between a voltage drain of said transistor unit becomes substantially zero and wherein the size of the main current to the load from the first transistor is the control current multiplied by said scaling factor, K.

21. Device according to claim 20, wherein the parameters $b_1$ and $b_2$ are the channel widths of the transistor units.

22. Device according to claim 20, wherein the ohmic region is determined based upon a relationship between a drain current and a gate-drain voltage.

23. Device according to claim 20, wherein the control unit is connected to first connection point between the load and the drain of the first transistor unit and to a second, connection point between the drain of the second transistor unit and the controllable current generator.

24. Device of claim 20, wherein the first and second transistors function as variable resistors.

25. Device according to claim 20, wherein the two transistor units and the control unit are integrated on the same chip.

26. Device according to claim 20, wherein the device is arranged in at least one transmission unit in a portable radio equipment for controlling at least one current.

27. Device according to claim 20, wherein a variable voltage generator is connected to the reference point.

28. Device according to claim 20, wherein the reference point is grounded.

29. Device according to claim 20, wherein the load is a final stage.

30. Device according to claim 20, wherein the two transistor units are arranged on the same chip.

31. Device according to claim 20, wherein the first and the second transistor units are a first and a second CMOS-transistor, wherein an emitter on the respective transistors is connected to the supply voltage and a control on the respective transistors is connected to the reference point, and furthermore the drain on the first transistor is connected to the load and the drain on the second transistor is connected to the current generator.

32. Device according to claim 31, wherein the two transistors are arranged on the same chip.

33. Device according to claim 31, wherein the two transistors are arranged in a capsule.

34. Device according to claim 31, wherein the two transistors and the control unit are integrated on the same chip.

35. Device of claim 31, wherein said CMOS transistor units are p-channel transistor units.

36. Device according to claim 20, wherein the two transistor units are arranged in a capsule.

37. A method for controlling a second current to a certain value by means of a mirroring using a first and a second transistor unit each operating in an ohmic state, wherein the method comprises the following steps:
   a) setting a first current in a first resistive branch which includes said first transistor operating in said ohmic state comprising a controllable current generator;
   b) reproducing the first current by the second current in a second resistive branch which includes said second transistor operating in said ohmic state comprising a load;
   c) forming a quantity which corresponds to the difference between the first and the second current size;
   d) checking the value of the quantity against a predetermined value; and
   e) adjusting the value of the quantity by means of a change of the second current until the quantity takes up the predetermined value, wherein the second current becomes a scaling factor K times greater than the first current, where the scaling factor is given by a relationship $b_1/b_2$ between a first and second parameter of the transistor units, wherein the size of the first parameter $b_1$ is greater than the size of the second parameter $b_2$.

38. Method according to claim 37, wherein step c) is performed through a control unit measuring a voltage difference between a first connection point on the second resistive branch and a second connection point on the first resistive branch.

39. Method according to claim 37, wherein step d) is performed through the control unit comparing the value of the voltage difference to the predetermined value 0 V.

40. Method according to claim 37, wherein step g) is performed through a voltage in a reference point being adjusted by a voltage generator.

41. Method of claim 37, wherein the first and second transistors function as variable resistors.

42. Method according to claim 37, wherein the method also comprises the following steps:

f) making a decision to adjust a resistance in the respective branch;
   g) adjusting the resistance in the respective branch.

43. A method for measuring the size of a second current by means of a mirroring using first and second transistor units operating in an ohmic state, wherein the method comprises the following steps:
   a) reproducing the second current in a first current, wherein the second current flows in a second resistive branch including said second transistor operating in said ohmic state and the first current flows in a first resistive branch including said first transistor operating in said ohmic state,
   b) forming a quantity which corresponds to the difference between the first and the second current sizes;
   c) checking the value of the quantity against a predetermined value;
   d) adjusting the value of the quantity by means of a change of the first current until the quantity has the predetermined value, wherein the second current becomes a scaling factor K times greater than the first current, where the scaling factor is given by a certain relationship $b_1/b_2$ between a first and second parameter of the transistor units, wherein the size of the first parameter $b_1$ is greater than the size of the second parameter $b_2$;
   e) forming a second quantity which corresponds to the size of the first current; and
   f) calculating the size of the second current by means of the second quantity and the scaling factor K.

44. Method according to claim 43, wherein the method also comprises the following steps:
   g) a decision is made to adjust a resistance in the respective branch;
   h) the resistance in the respective branches is adjusted.

45. Method according to claim 44, wherein step h) is performed by a voltage in a reference point being adjusted by a voltage generator.

46. Device of claim 43, wherein the first and second transistors function as variable resistors.

47. Method according to claim 43, wherein step b) is performed through a control unit measuring a voltage difference between a first connection point on the second resistive branch and a second connection point on the first resistive branch.

48. Method according to claim 43, wherein step c) is performed through the control unit comparing the value of the voltage difference with the predetermined value 0 V.

49. A device for controlling current, comprising:
   first and second transistor units operating in an ohmic state wherein said first and second transistor units function as variable resistances,
   wherein each transistor unit is connected to a supply voltage and to a reference point,
   wherein said first transistor unit is connected to a load and emits a current to the load,
   wherein the second transistor unit is arranged such that a mirroring occurs between the control current driven through said second transistor unit and the main current;
   a current generator which is arranged to drive the control current through the second transistor unit; and
   a control unit arranged to regulate the main current to the load so that a voltage difference between a voltage drain of said transistor unit becomes substantially 0 V.

* * * * *